United States Patent
Tsai et al.

(10) Patent No.: US 10,014,352 B1
(45) Date of Patent: Jul. 3, 2018

(54) DISPLAY DEVICE

(71) Applicant: HANNSTOUCH SOLUTION INCORPORATED, Tainan (TW)

(72) Inventors: Ching-Feng Tsai, Tainan (TW); Shi-Wei Ma, Tainan (TW)

(73) Assignee: HANNSTOUCH SOLUTION INCORPORATED, Tainan (TW)

(*) Notice: Subject to any disclaimer, the term of this patent is extended or adjusted under 35 U.S.C. 154(b) by 0 days.

(21) Appl. No.: 15/644,822

(22) Filed: Jul. 9, 2017

(30) Foreign Application Priority Data

May 27, 2017 (CN) .......................... 2017 1 0389171

(51) Int. Cl.
*H01L 33/00* (2010.01)
*H01L 27/32* (2006.01)
*H01L 51/52* (2006.01)
*H01L 51/56* (2006.01)

(52) U.S. Cl.
CPC ........ *H01L 27/323* (2013.01); *H01L 51/5253* (2013.01); *H01L 51/5275* (2013.01); *H01L 27/3244* (2013.01); *H01L 51/56* (2013.01); *H01L 2251/5338* (2013.01); *H01L 2251/558* (2013.01)

(58) Field of Classification Search
CPC . H01L 51/5253; H01L 51/5275; H01L 51/56; H01L 51/0097; H01L 27/323; H01L 27/3244; H01L 27/3267; H01L 27/3286; H01L 31/03926; H01L 2227/32
See application file for complete search history.

(56) References Cited

U.S. PATENT DOCUMENTS

2004/0160165 A1* 8/2004 Yamauchi ........... H01L 27/3246
                                                                        313/498
2016/0306390 A1* 10/2016 Vertegaal .............. G06F 1/1666

* cited by examiner

*Primary Examiner* — Yosef Gebreyesus
(74) *Attorney, Agent, or Firm* — CKC & Partners Co., Ltd.

(57) ABSTRACT

A display device includes a back board, a substrate, a display layer, and a cover lens. The back board includes a first portion, a second portion, and a bendable portion. The bendable portion is between the first portion and the second portion and separating the first portion from the second portion, and a rigidity of the bendable portion is smaller than a rigidity of the first portion and the second portion. The substrate is disposed on the first portion, the second portion, and the bendable portion, and the substrate is attached to the back board by an adhesive. The display layer is disposed on the substrate. The cover lens is disposed on the display layer.

15 Claims, 15 Drawing Sheets

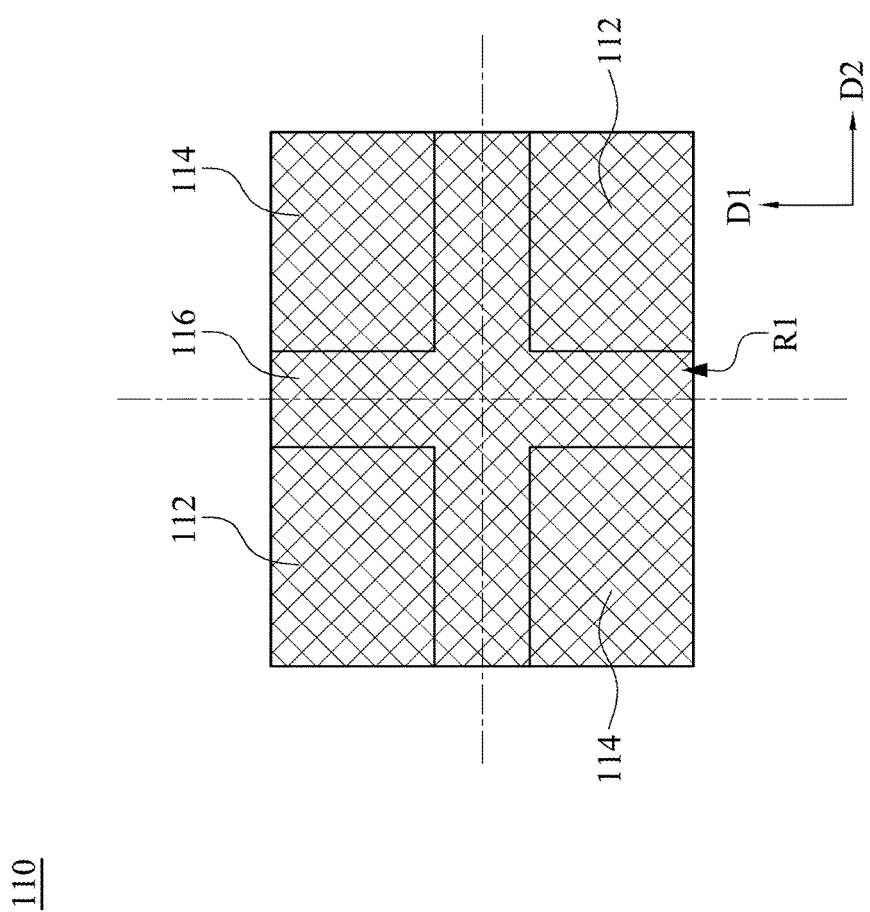

DISPLAY DEVICE

CROSS-REFERENCE TO RELATED APPLICATION

This application claims priority to China Application Serial Number 201710389171.1, filed May 27, 2017, which is herein incorporated by reference.

BACKGROUND

Field of Invention

The present invention relates to a display device.

Description of Related Art

In recent years, touch display panels, serving as input and output devices, have been widely applied in the field of electronic products. Touch display panels have further developed into flexible touch display panels, in which flexible materials substitute for rigid materials, such that the touch display panels may bend when external forces are exerted thereon.

However, the bending of components may result in various problems. For example, it is less desired to bend for portions of the components because of their greater thickness and material stress. Alternatively, while bending, portions of the components may peel off, distort, or show abnormal electric properties under the influence of greater layer stress. As such, how to maintain the mechanical strength of the stack configuration of the touch display panel, and improving flexural endurance and resistance to pressure of the components is a problem to be solved.

SUMMARY

In the embodiments of present invention, by designing the bendable portions of the back board and the cover lens to optionally include trenches, recesses, or openings, a rigidity of the bendable portion of the back board or the cover lens is less than a rigidity of other portions, and therefore facilitate the bending of the display device.

According to some embodiments of the present invention, a display device includes a back board, a substrate, a display layer, and a cover lens. The back board includes a first portion, a second portion, and a bendable portion. The bendable portion is between the first portion and the second portion and separating the first portion from the second portion, and a rigidity of the bendable portion is smaller than a rigidity of the first portion and the second portion. The substrate is disposed on the first portion, the second portion, and the bendable portion, and the substrate is attached to the back board by an adhesive. The display layer is disposed on the substrate. The cover lens is disposed on the display layer.

In the embodiments of the present invention, a thickness of the bendable portion is smaller than a thickness of the first portion and the second portion, such that the bendable portion, the first portion, and the second portion form a trench, in which an opening of the trench faces away from the substrate.

In the embodiments of the present invention, the bendable portion comprises plural openings arranged in the trench.

In the embodiments of the present invention, a thickness of the bendable portion is equal to a thickness of the first portion multiplied by a value ranging from 0.3 to 0.8.

In the embodiments of the present invention, a thickness of the bendable portion is less than 50 micrometers.

In the embodiments of the present invention, the bendable portion comprises plural recesses, and openings of the recesses faces away from the substrate.

In the embodiments of the present invention, the bendable portion comprises plural openings.

In the embodiments of the present invention, the cover lens comprises a first portion, a second portion, and a bendable portion, the bendable portion of the cover lens is between the first portion and the second portion of the cover lens, the bendable portion of the cover lens is on the bendable portion of the back board, and a rigidity of the bendable portion of the cover lens is smaller than a rigidity of the first portion and the second portion of the cover lens.

In the embodiments of the present invention, an extending direction of the bendable portion of the cover lens is parallel with an extending direction of the bendable portion of the back board.

In the embodiments of the present invention, the bendable portion of the cover lens comprises at least one trench facing the substrate.

In the embodiments of the present invention, the display device further includes an optical clear adhesive disposed between the display layer and the cover lens, wherein the optical clear adhesive fills the trench of the bendable portion of the cover lens.

In the embodiments of the present invention, the display device further includes an optical clear adhesive and a spacer. The optical clear adhesive disposed is between the display layer and the cover lens. The spacer is disposed between the cover lens and the optical clear adhesive, in which the spacer has at least one tilted surface adjoining the optical clear adhesive, and the tilted surface slopes with respect to a bottom surface of the cover lens.

In the embodiments of the present invention, the display device further includes an optical clear adhesive and a spacer. The optical clear adhesive disposed is between the display layer and the cover lens. The spacer is disposed between the optical clear adhesive and the display layer, in which the spacer has at least one tilted surface adjoining the optical clear adhesive, and the tilted surface slopes with respect to a bottom surface of the cover lens.

According to some embodiments of the present invention, a display device includes a substrate, a display layer, and a cover lens. The display layer is disposed on the substrate. The cover lens is disposed on the display layer. The cover lens includes a first portion, a second portion, and a bendable portion, in which the bendable portion of the cover lens is between the first portion and the second portion of the cover lens, and a rigidity of the bendable portion of the cover lens is smaller than a rigidity of the first portion and the second portion of the cover lens, in which the substrate is attached to a back board by an adhesive.

In some embodiments of the present invention, the bendable portion includes at least one trench facing the substrate.

According to some embodiments of the present invention, a display device includes a substrate, a display layer, a cover lens, an optical clear adhesive, and plural spacers. The display layer is disposed on the substrate. The cover lens is disposed on the display layer. The optical clear adhesive is disposed between the display layer and the cover lens. The spacers are disposed between the cover lens and the optical clear adhesive or between the optical clear adhesive and the display layer, in which at least one of the spacers has at least one tilted surface adjoining the optical clear adhesive, and the tilted surface slopes with respect to a bottom surface of the cover lens.

In some embodiments of the present invention, the display device includes an optical film disposed between the optical clear adhesive and the display layer, and the spacers are attached to the optical film.

BRIEF DESCRIPTION OF THE DRAWINGS

The invention can be more fully understood by reading the following detailed description of the embodiment, with reference made to the accompanying drawings as follows:

FIG. 2 is a top schematic view of a back board of the display device according to some embodiments of the invention;

DETAILED DESCRIPTION

Figure 1A:
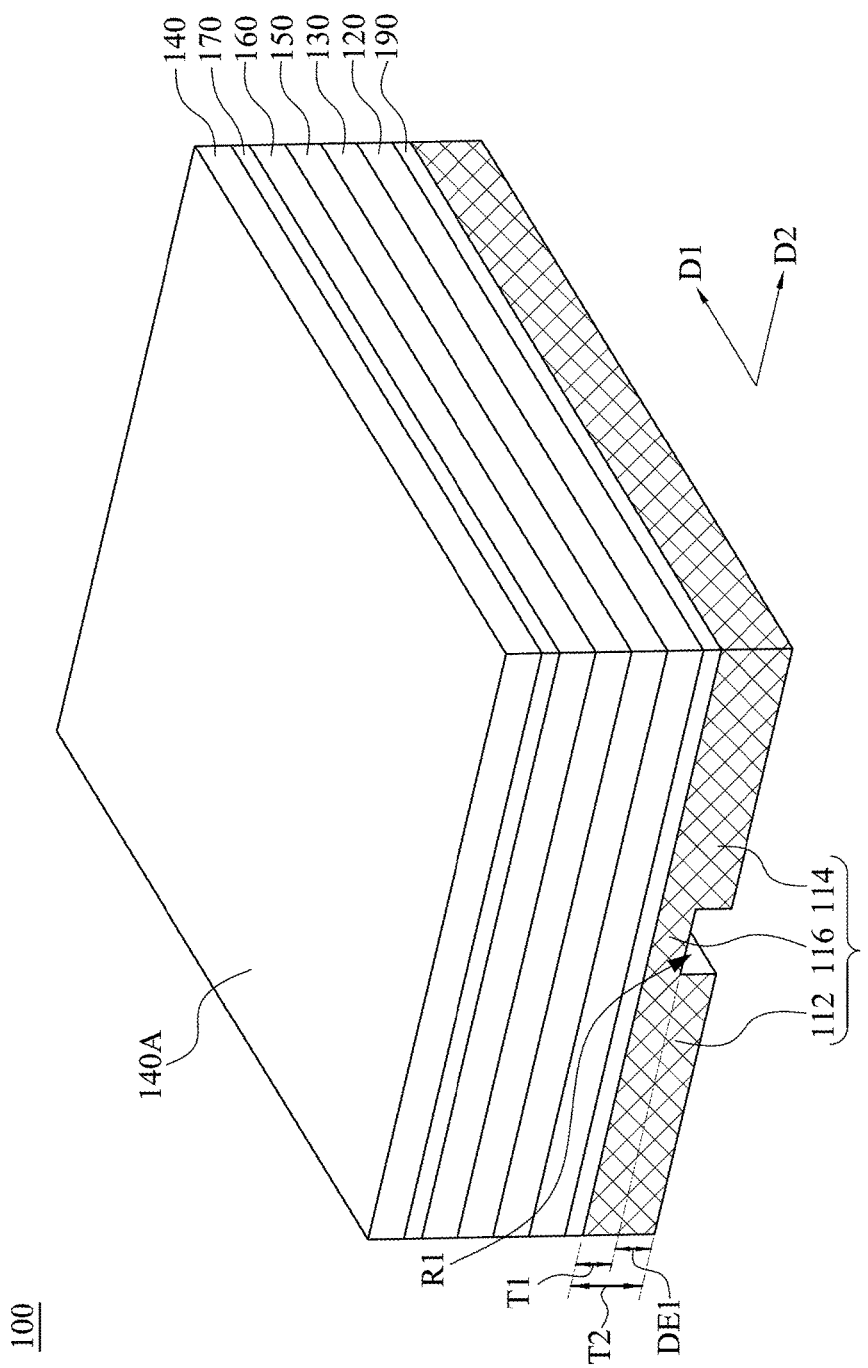
FIG. 1A is a stereo schematic view of a display device according to some embodiments of the invention.

Reference will now be made in detail to the present embodiments of the invention, examples of which are illustrated in the accompanying drawings. Wherever possible, the same reference numbers are used in the drawings and the description to refer to the same or like parts.

FIG. 1A is a stereo schematic view of a display device 100 according to some embodiments of the invention. The display device 100 includes a back board 110, a substrate 120, a display layer 130, and a cover lens 140. The back board 110 includes a first portion 112, a second portion 114, and a bendable portion 116. The bendable portion 116 is between the first portion 112 and the second portion 114 and separating the first portion 112 from the second portion 114, and a rigidity of the bendable portion 116 is smaller than a rigidity of the first portion 112 and the second portion 114. The substrate 120 is disposed on the first portion 112, the second portion 114, and the bendable portion 116 of the back board 110. The substrate 120 has a flexible property, and the back board 110 is attached to a surface of the substrate 120 by an adhesive 190, such that the back board 110 and the substrate 120 are fixed with each other. The display layer 130 is disposed on the substrate 120, and the display layer 130 includes plural display components which may be flexible, such as organic light-emitting diodes, but the present invention is not limited thereto. The cover lens 140 is disposed on the display layer 130, and the cover lens 140 may also have a flexible property.

In some embodiments, the display device 100 may be a touch display device. To be specific, the display device 100 may further include a touch sensing layer 150, which may be disposed between the display layer 130 and the cover lens 140. When the cover lens 140 is touched by a finger of a user, the touch sensing layer 150 may detect the variation of capacitance of the electrodes, and obtaining a position touched by the finger. In an example, the touch sensing layer 150 at least includes a substrate and a sensing electrode layer (e.g., transparent conductive layer such as indium tin oxide layer or metal layer) disposed on the substrate. In some embodiments, the touch sensing layer 150 may have flexible and unbreakable properties.

In plural embodiments of the present invention, the back board 110, the substrate 120, the display layer 130, the cover lens 140, and the touch sensing layer 150 has a certain flexibility, and therefore the display device 100 is a flexible display device. In some embodiments, a rigidity of the material of the back board 110 is greater than rigidities of materials of the substrate 120, the display layer 130, the cover lens 140, and the touch sensing layer 150, and the back board 110 offers a supporting effect and further maintain the structural stability of the flexible display device.

In some embodiments of the present invention, the display device 100 further includes an optical film 160 and an optical clear adhesive 170. Herein, the optical film 160 may include polarizers and others, and the optical film 160 is disposed between the touch sensing layer 150 and the cover lens 140. The optical clear adhesive 170 is disposed between the touch sensing layer 150 and the cover lens 140. To be specific, the optical clear adhesive 170 is disposed between the optical film 160 and the cover lens 140. The optical clear adhesive 170 is transparent, such that the optical clear adhesive 170 can fix a combination of the substrate 120, the display layer 130, and the touch sensing layer 150 to the cover lens 140 and allow light passes through itself.

Figure 1B:
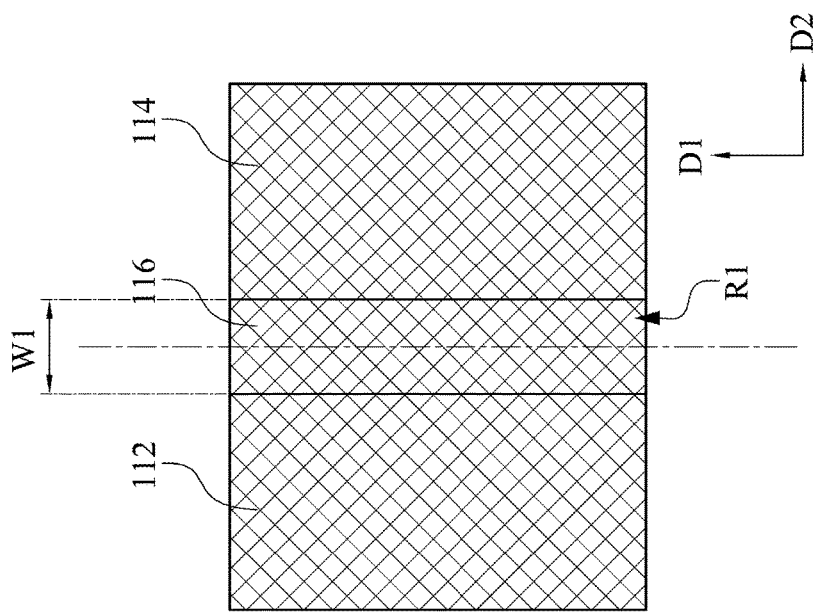
FIG. 1B is a top schematic view of a back board of the display device of FIG. 1A.

FIG. 1B is a top schematic view of a back board 110 of the display device 100 of FIG. 1A. Reference is made to FIG. 1A and FIG. 1B. In plural embodiments of the present invention, the bendable portion 116 extends along a direction D1, and the first portion 112, the bendable portion 116, and the second portion 114 are sequentially arranged along a direction D2, in which the direction D1 intersects with the direction D2. In some embodiments, the direction D1 is orthogonal to the direction D2. Through this configuration, the display device 100 may bend along the direction D2. For example, the first portion 112 and the second portion 114 may fold up along the dashed line in FIG. 1B and overlap.

In the present embodiments, through the configuration of the different thicknesses, a rigidity of the bendable portion 116 is smaller than a rigidity of the first portion 112 and the second portion 114. To be specific, in the present embodiments, a thickness T1 of the bendable portion 116 is smaller than a thickness T2 of the first portion 112 and the second portion 114, such that the bendable portion 116, the first portion 112, and the second portion 114 forms a trench R1 extending along the direction D1, with an opening of the trench R1 faces away from the substrate 120. Through this configuration, when the display device 100 folds up in a manner that the back board 110 faces outside and the cover lens 140 faces inside, while a bending stress at an outer layer is greater than a bending stress at an inner layer, the trench R1 may release the bending stress of the back board 110, thereby facilitate the bending of the display device 100.

Herein, a section of the trench R1 is a rectangle, but it should not limit the scope of the present invention. In other embodiments, the section of the trench R1 may be a trapezoid, a triangle, a half-circle, etc.

In some embodiments of the present invention, the depth DE1 of the trench R1 may be designed adequately so as to prevent the bending of the back board 110 from yielding a disadvantageous result to the transmission of light (e.g., the back board 110 becomes opaque). For example, the material of the back board 110 may be polyethylene terephthalate (PET), and the thickness T1 of the bendable portion 116 may be less than 50 micrometers, such as 20 to 30 micrometers. Herein, the thickness T2 of the first portion 112 and the second portion 114 ranges from about 80 micrometers to about 150 micrometers. In some embodiments, the thickness T1 of the bendable portion 116 is equal to the thickness T2 of the first portion 112 multiplied by a value ranging from 0.3 to 0.8, thereby facilitate the supporting effect and the bending of the back board 110.

Herein, the bendable portion 116 may bend with a radius of curvature of 1 millimeter to 8 millimeters. For example, in some embodiments, the bendable portion 116 may bend with a minimum allowable radius of curvature of 1 millimeter to 4 millimeters. In some embodiments, a width W1 of the bendable portion 116 is equal to or greater than the radius of curvature of the bending thereof. For example, if the first portion 112 and the second portion 114 on two sides of the bendable portion 116 fold up such that the bendable portion 116 bends with 180 degrees, the width W1 of the bendable portion 116 may be designed to be greater than the minimum allowable radius of curvature of the bending multiplied by π (i.e., a ratio of the circumference of a circle to its diameter) and less than the minimum allowable radius of curvature of the bending multiplied by 2π. In some embodiments, while the bendable portion 116 bends, the first portion 112 and the second portion 114 may also bend, and the bending of the bendable portion 116 may not be designed to achieve the 180 degrees; at the time, the width W1 of the bendable portion 116 may be designed to be less than 1 millimeter, thereby preventing the bendable portion 116 from affecting the visual effect.

In some embodiments of the present invention, the back board 110 is formed of a material which is resistant to 300 degrees Celsius and has adequate rigidity. For example, the material of the back board 110 may be polyethylene terephthalate (PET), and the thickness T2 of the back board 110 ranges from about 50 micrometers to about 200 micrometers, such as 100 micrometers. Herein, the thickness of the substrate 120 ranges from about 5 micrometers to about 20 micrometers, such as 10 micrometers. The material of the substrate 120 may be polyimide (PI), polycarbonate (PC), polyetherimide (PEI), ultra-thin glass, etc, and may be unbreakable and flexible. The adhesive 190 may be transparent or opaque. For example, the adhesive 190 may be an optical clear adhesive or a double coated tape.

In some embodiments of the present invention, takes the active-matrix organic light-emitting diode (AMOLED) for example. For example, the substrate 120 may include an active device substrate, the display layer 130 may include an organic light-emitting diode, in which the organic light-emitting diode may include a hole injection layer, a hole transport layer, ab electron transport layer, ab electron injection layer, ab electron blocking layer, and hole blocking layer. However, it should not limit the scope of the present invention. In other embodiments, the substrate 120 and the display layer 130 may include a backlight module, an active device substrate, a display medium, a color filter substrate, and so on, in which the display medium may be liquid crystal material or electrophoresis material.

In some embodiments of the present invention, the touch sensing layer 150 may be formed by single or double touch electrode layers, and may operate in self-capacitance detection or in mutual-capacitance detection. The touch sensing layer 150 may be designed in accordance with the configuration of the substrate 120 and the display layer 130, and the touch sensing layer 150 is not limited to be on the display layer 130. In some embodiments of the present invention, the material of the cover lens 140 may be polyimide (PI), polyethylene terephthalate (PET), or other suitable materials. The cover lens 140 is configured to protect plural layers of the display device, and the cover lens 140 has a top surface 140A that may be touched by fingers.

FIG. 2 is a top schematic view of a back board 110 of the display device 100 according to some embodiments of the invention. The present embodiments are similar to the embodiments of FIG. 1B, and the difference between the present embodiments and the embodiments of FIG. 1B is: in the present embodiments, the trench R1 has a cross shape. In other words, herein the trench R1 extends along the direction D1 and the direction D2, and therefore the back board 110 may bend along the direction D1 and the direction D2. For example, the first portion 112 and the second portion 114 may fold up along the dashed lines in FIG. 2 and overlap, in which the dashed lines in the figure are a line of symmetry of the short side of the back board 110 and a line of symmetry of the long side of the back board 110. In some embodiments of the present invention, a section of the trench R1 may be a rectangle, a trapezoid, a triangle, a half-circle, etc.

Other details of the present embodiments are similar to those in the present embodiments of FIG. 1B, and therefore not repeated herein.

Figure 3A:
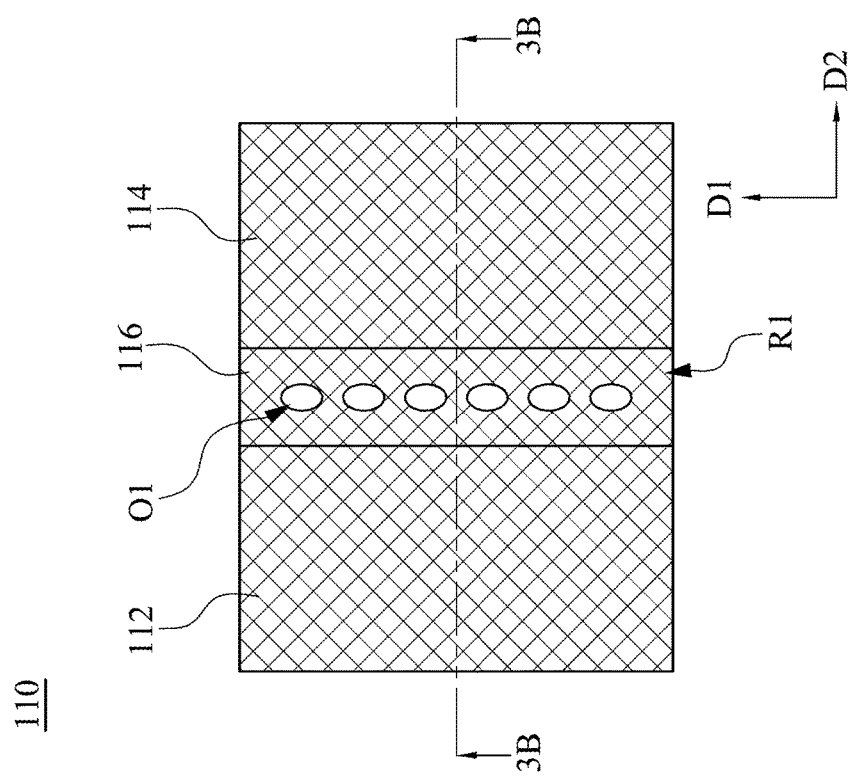
FIG. 3A is top schematic view of a back board of a display device according to some embodiments of the invention.
Figure 3B:
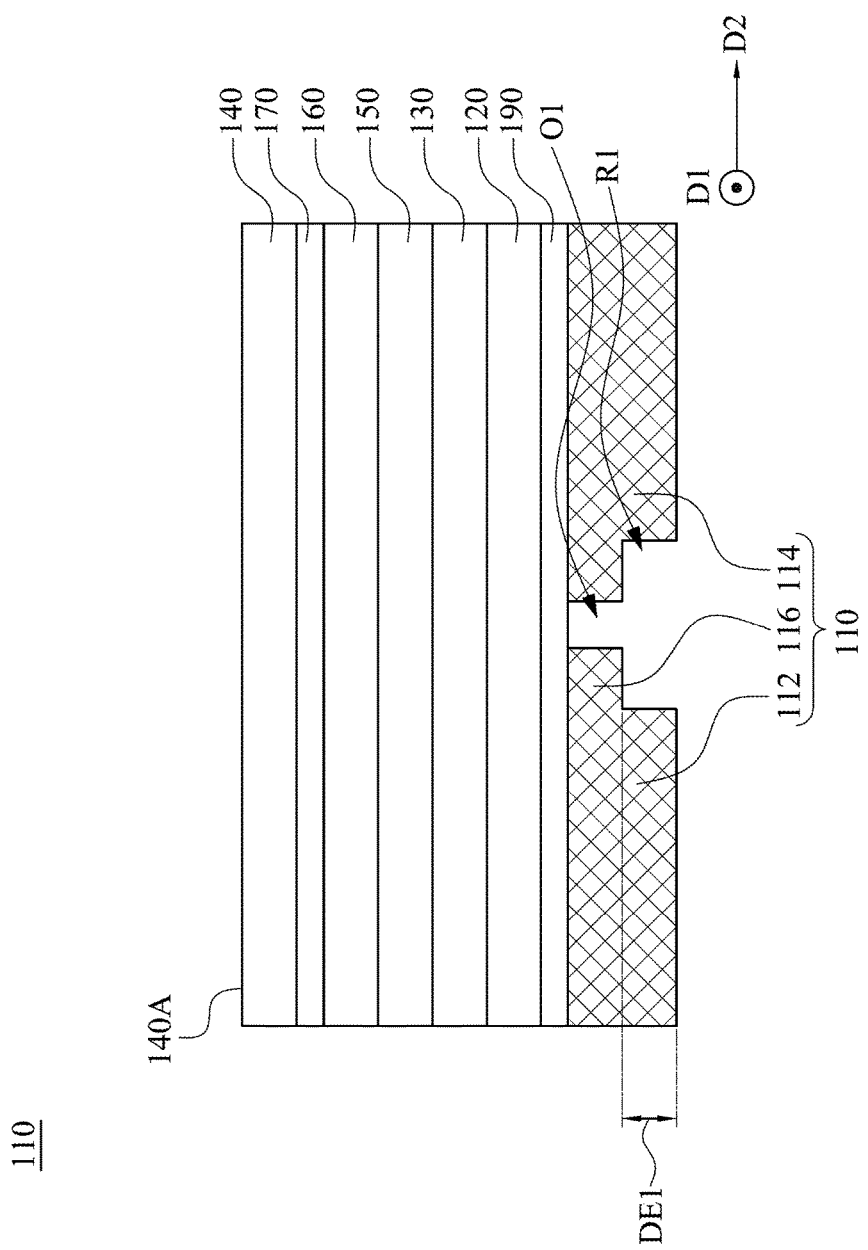
FIG. 3B is a cross-sectional schematic view taken along line 3B-3B of FIG. 3A.

FIG. 3A is top schematic view of a back board 110 of a display device 100 according to some embodiments of the invention. FIG. 3B is a cross-sectional schematic view taken along line 3B-3B of FIG. 3A. The present embodiments are similar to the embodiments of FIG. 1B, and the difference between the present embodiments and the embodiments of FIG. 1B is: in the present embodiment, the bendable portion 116 includes plural openings O1 arranged in the trench R1. Herein, the openings O1 penetrate through the bendable portion 116 and expose the substrate 120 or the adhesive 190. Through the configuration, while the first portion 112 and the second portion 114 of the back board 110 are structural connected, the trench R1 and the openings O1 may release the bending stress of the back board 110, thereby facilitate the bending of the display device 100.

In some embodiments, the openings O1 are disconnected from each other, and the openings O1 may be sequentially arranged along the direction D1. Herein, the openings O1 are arranged in one column, but it should not limit the scope of the present invention. The openings O1 may be arranged in plural columns along about the direction D1. Herein, the openings O1 are circles. In other embodiments, the openings O1 may have other shapes, such as squares, ellipse, rectangles, and so on. In the present embodiments, the shapes and sizes of the openings O1 are substantially the same. In other embodiments, the shapes and sizes of the openings O1 may not be the same at all, they can be designed according to the actual requirement. Other details of the present embodiments are similar to those in the present embodiments of FIG. 1B, and therefore not repeated herein.

Figure 4:
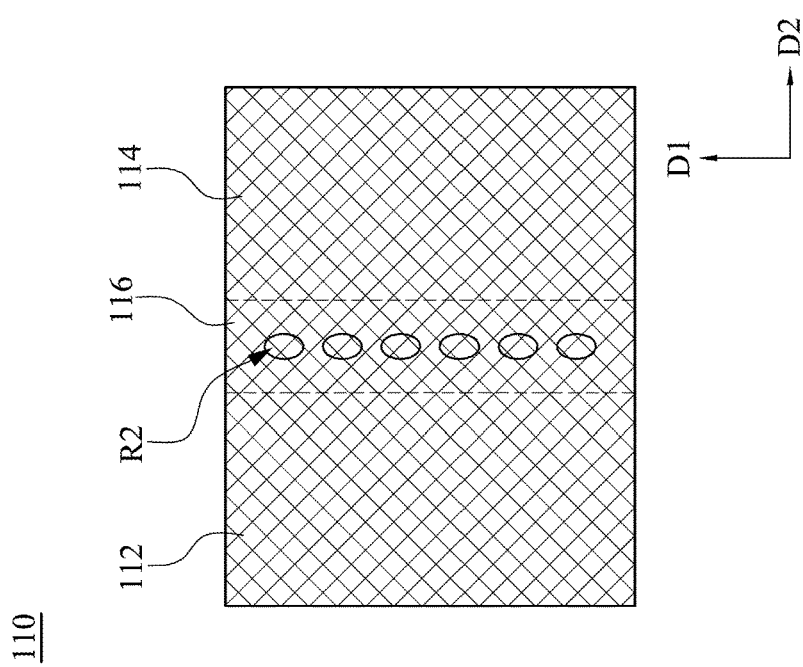
FIG. 4 is a top schematic view of a back board of a display device according to some embodiments of the invention.

FIG. 4 is a top schematic view of a back board 110 of a display device 100 according to some embodiments of the invention. The present embodiments are similar to the embodiments of FIG. 1B, and the difference between the present embodiments and the embodiments of FIG. 1B is: in the present embodiments, the bendable portion 116 includes plural recesses R2 with the openings of the recesses R2 faces away from the substrate 120. Through the configuration, while the first portion 112 and the second portion 114 of the back board 110 are structural connected, the recesses R2 may release the bending stress of the back board 110, thereby facilitate the bending of the display device 100.

Herein, a thickness of a portion of the bendable portion 116 where the recesses R2 are not located is approximately or exactly equal to the thickness of the first portion 112 and the second portion 114. A thickness of another portion of the bendable portion 116 where the recesses R2 are located is less than the thickness of the first portion 112 and the second portion 114, and the recesses R2 do not penetrate through the back board 110.

In the present embodiments, the recesses R2 disconnected from each other, and the bendable portion 116 does not include a trench. As the configuration of the openings O1 as aforementioned, the recesses R2 may be arranged in one or plural columns. Herein, the recesses R2 are circles. In other embodiments, the recesses R2 may have other shapes, such as squares, ellipse, rectangles, and so on. In the present embodiments, the shapes, sizes, and depths of the recesses R2 are substantially the same. In other embodiments, the shapes, sizes, and depths of the recesses R2 may not be the same at all, they can be designed according to the actual requirement. Other details of the present embodiments are similar to those in the present embodiments of FIG. 1B, and therefore not repeated herein.

Figure 5:
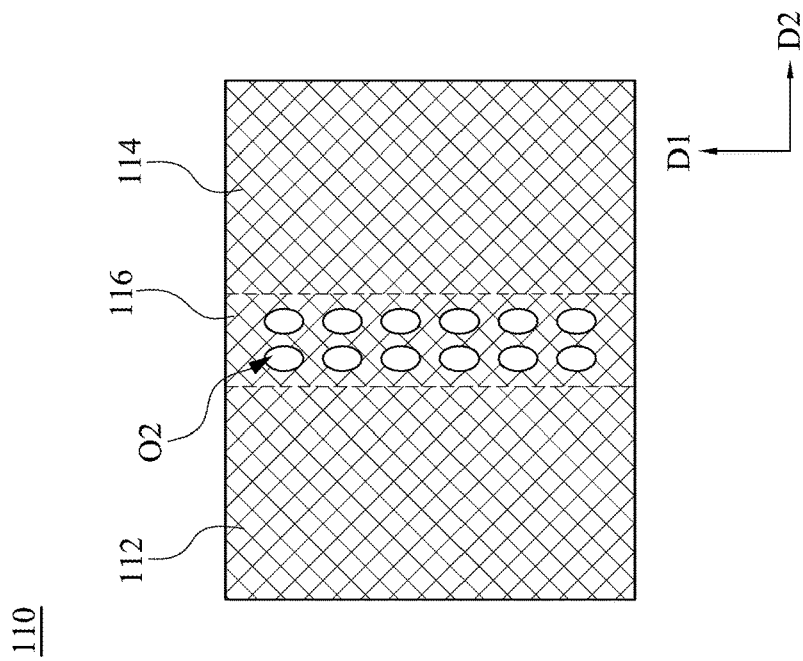
FIG. 5 is a top schematic view of a back board of a display device according to some embodiments of the invention.

FIG. 5 is a top schematic view of a back board 110 of a display device 100 according to some embodiments of the invention. The present embodiments are similar to the embodiments of FIG. 3A, and the difference between the present embodiments and the embodiments of FIG. 3A is: in the present embodiments, the bendable portion 116 includes plural openings O2. Herein, the openings O2 penetrate through the bendable portion 116 and expose the substrate 120 (referring to FIG. 1A). Through the configuration, while the first portion 112 and the second portion 114 of the back board 110 are structural connected, the openings O2 may release the bending stress of the back board 110, thereby facilitate the bending of the display device 100.

In the present embodiments, the bendable portion does not include the trench. In the present embodiments, a thickness of a portion of the bendable portion 116 where the openings O2 are not located is approximate equal to the thickness of the first portion 112 and the second portion 114.

In the present embodiments, the openings O2 are disconnected from each other. As the configuration of the openings O1 as aforementioned, the openings O2 may be arranged in one or plural columns. For example, herein the openings O2 are arranged in two columns. In the present embodiments, the openings O2 are circles. In other embodiments, the openings O2 may have other shapes, such as squares, ellipse, rectangles, and so on. In some embodiments, the shapes and sizes of the openings O1 are substantially the same. In other embodiments, the shapes and sizes of the openings O1 may not be the same at all, they can be designed according to the actual requirement. Other details of the present embodiments are similar to those in the present embodiments of FIG. 1B, and therefore not repeated herein.

Figure 6A:
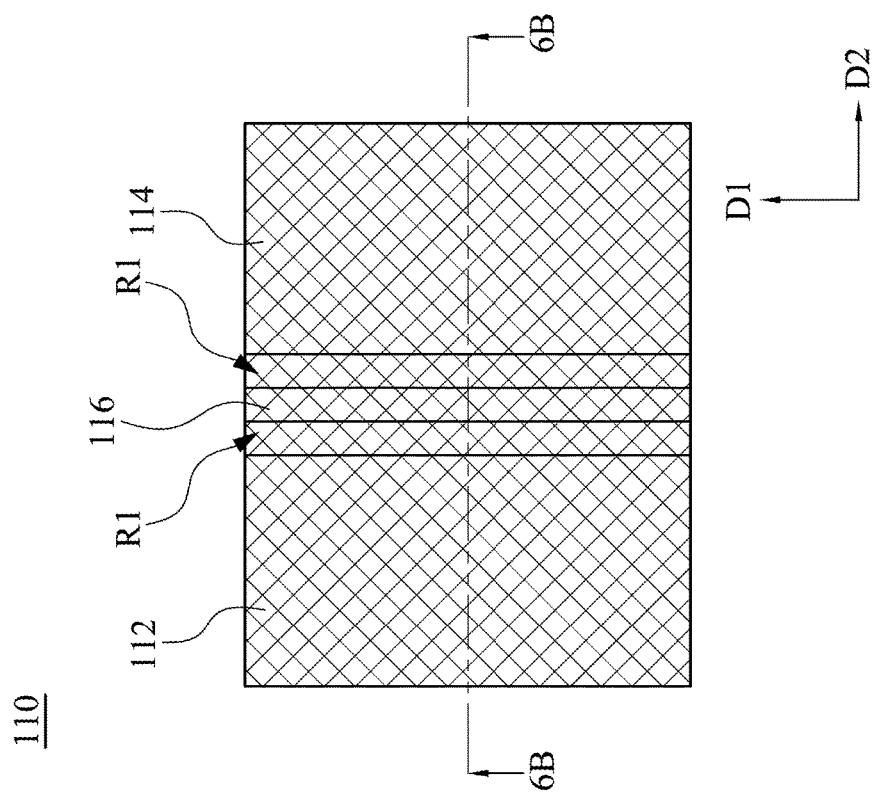
FIG. 6A is a top schematic view of a back board of a display device according to some embodiments of the invention.
Figure 6B:
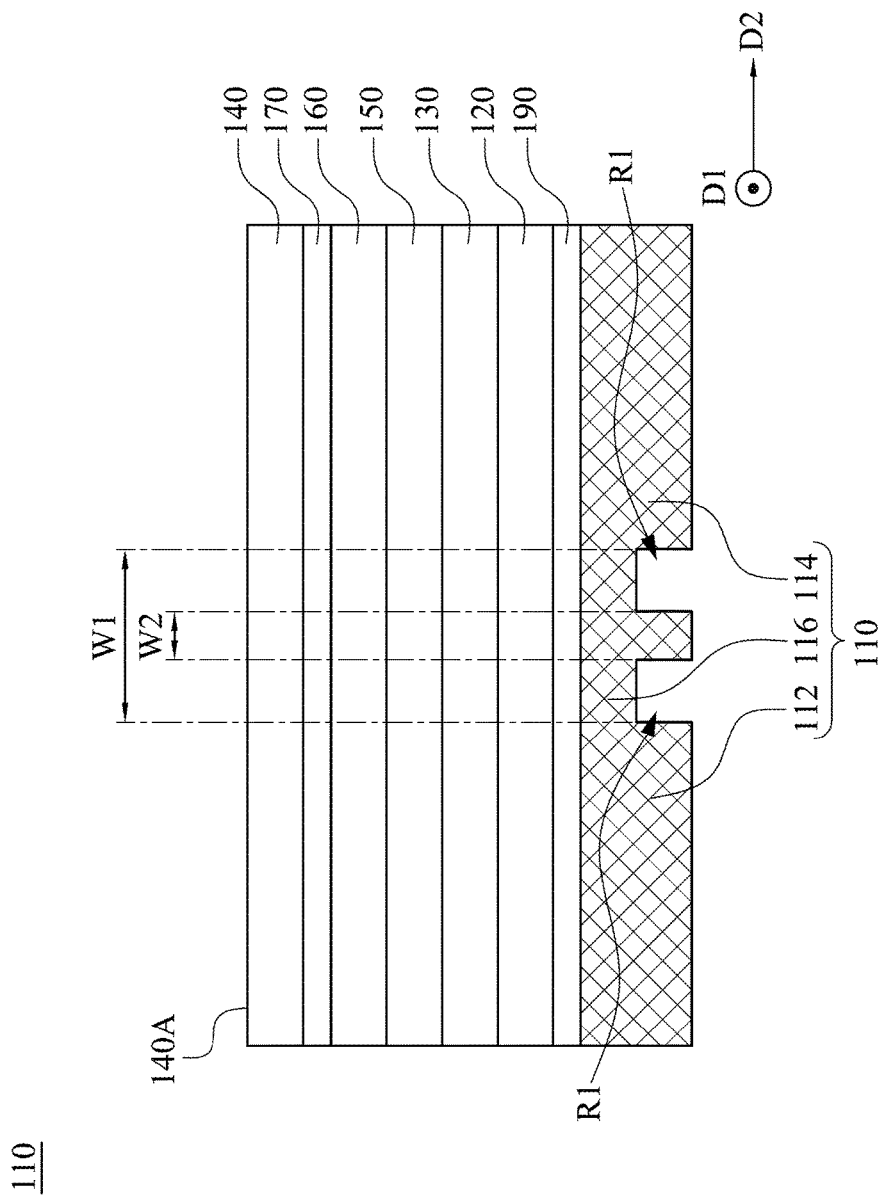
FIG. 6B is a cross-sectional schematic view taken along line 6B-6B of FIG. 6A.

FIG. 6A is a top schematic view of a back board 110 of a display device 100 according to some embodiments of the invention. FIG. 6B is a cross-sectional schematic view taken along line 6B-6B of FIG. 6A. The present embodiments are similar to the embodiments of FIG. 1B, and the difference between the present embodiments and the embodiments of FIG. 1B is: in the present embodiments, the bendable portion 116 includes plural trenches R1 arranged along the direction D2 and extending along the same direction D1. Through the configuration, the trenches R1 may release the bending stress of the back board 110, thereby facilitate the bending of the display device 100.

Herein, a distance W2 between the trenches R1 of the bendable portion 116 is less than the aforementioned width W1 of the bendable portion 116. For example, the distance W2 is less than 1 millimeter, thereby preventing the visual effect from being affected.

Herein, a section of the trenches R1 (not shown) may be a rectangle, a trapezoid, a triangle, a half-circle, etc. In addition, though not shown in the figure, the portion of the bendable portion 116 where the trenches R1 are not located may have a thickness approximate equal to the thickness of the first portion 112 and the second portion 114. Other details of the present embodiments are similar to those in the present embodiments of FIG. 1B, and therefore not repeated herein.

Figure 7:
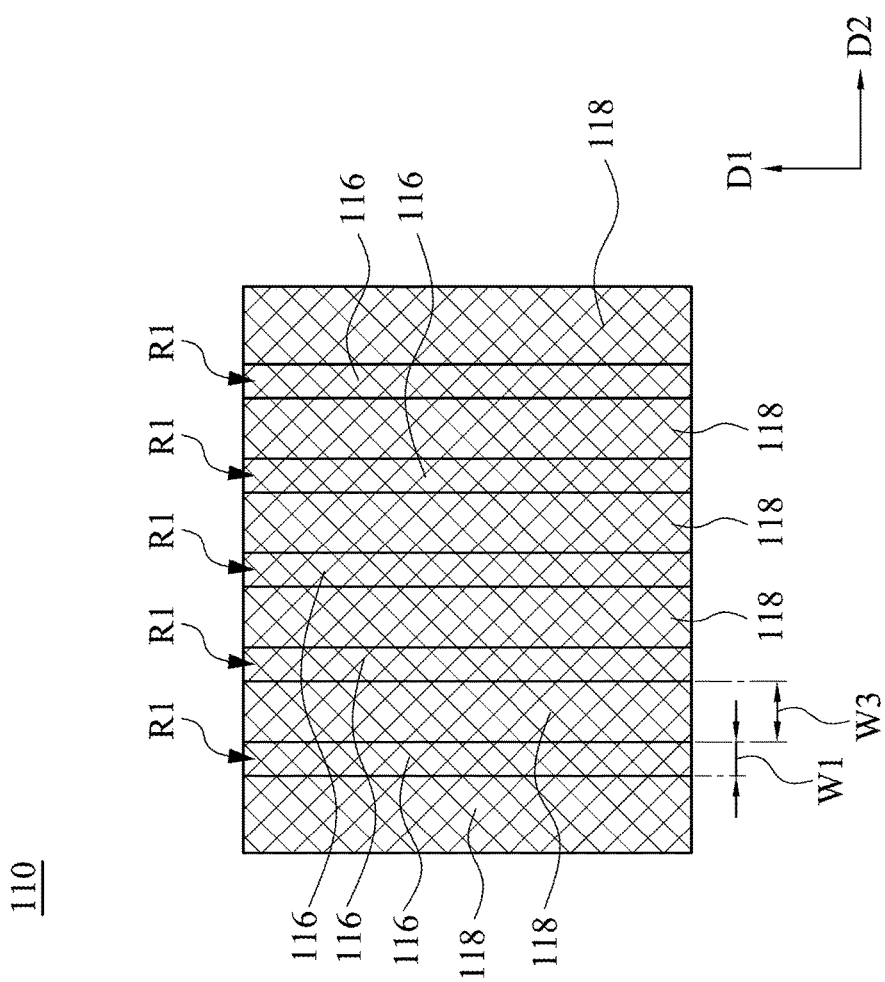
FIG. 7 is a top schematic view of a back board of a display device according to some embodiments of the invention.

FIG. 7 is a top schematic view of a back board 110 of a display device 100 according to some embodiments of the invention. The present embodiments are similar to the embodiments of FIG. 1B, and the difference between the present embodiments and the embodiments of FIG. 1B is: in the present embodiments, the bendable portions 116 are in an equidistant distribution from left to right on the back board 110 uniformly, and therefore the display device 100 may roll up along the direction D2. Herein, the back board 110 includes the bendable portions 116 and unbendable portions 118, in which the rigidity of the bendable portions 116 is less than the rigidity of the unbendable portions 118. One of the bendable portions 116 are disposed between two adjacent unbendable portions 118, such that the back board 110 may be curved from left to right.

In the present embodiments, the bendable portions 116 are at equidistant positions along the direction D2. However, it should not limit the scope of the present invention. In other embodiment, each of the distances between each two adjacent bendable portions 116 can be designed according to the actual requirement. Herein, the distance W3 between the bendable portions 116 is greater than the width W1 of the bendable portions 116. For example, the distance W3 is greater than the width W1.

Other details of the present embodiments are similar to those in the present embodiments of FIG. 1B, and therefore not repeated herein.

Figure 8:
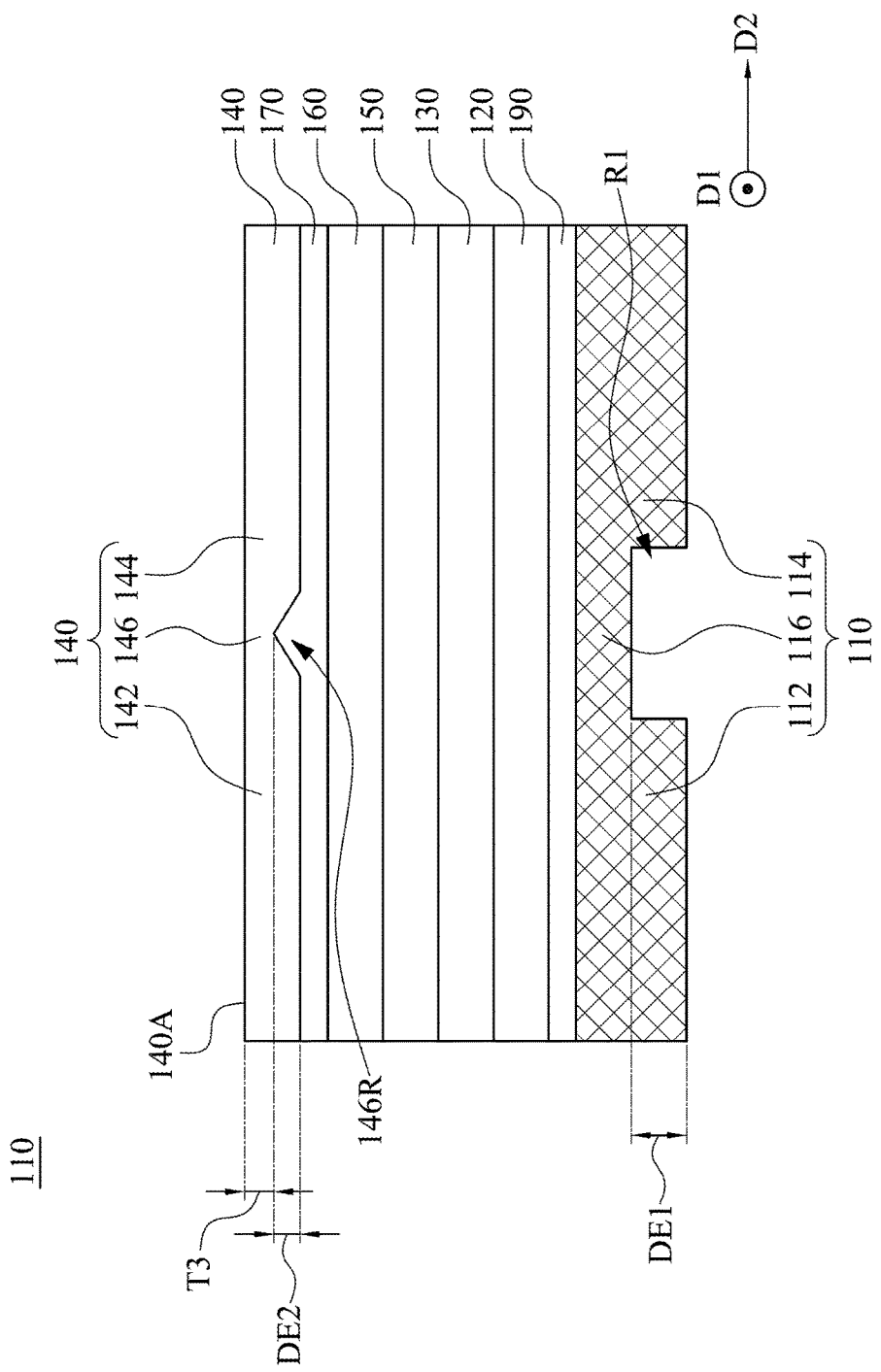
FIG. 8 is a cross-sectional schematic view of a display device according to some embodiments of the invention.

FIG. 8 is a cross-sectional schematic view of a display device 100 according to some embodiments of the invention. The present embodiments are similar to the embodiments of FIG. 1A, and the difference between the present embodiments and the embodiments of FIG. 1A is: in the present embodiments, the cover lens 140 includes a first portion 142, a second portion 144, and a bendable portion 146, in which the bendable portion 146 of the cover lens 140 is between the first portion 142 and the second portion 144 of the cover lens 140, such that the bendable portion 146 of the cover lens 140 separates the first portion 142 of the cover lens 140 from the second portion 144 of the cover lens 140. A rigidity of the bendable portion 146 of the cover lens 140 is smaller than a rigidity of the first portion 142 and the second portion 144 of the cover lens 140.

Herein the bendable portion 146 of the cover lens 140 is on the bendable portion 116 of the back board 110, and an extending direction of the bendable portion 146 of the cover lens 140, which is the direction D1 herein, is parallel with an extending direction of the bendable portion 116 of the back board 110.

In some embodiments of the present embodiments, a thickness of the bendable portion 146 of the cover lens 140 may be smaller than a thickness of the first portion 142 or the second portion 144. For example, the bendable portion 146 of the cover lens 140 has at least one trench 146R facing the substrate 120. The optical clear adhesive 170 may fill the trench 146R of the bendable portion 146 of the cover lens 140. Through this configuration, the trench 146R of the bendable portion 146 may release the bending stress of the cover lens 140, thereby facilitate the bending of the display device 100. Herein, a depth DE2 of the trench 146R is not greater than half a thickness T3 of the cover lens 140, such that the cover lens 140 can protect plural layers effectively. It is noted that, in other embodiments, plural disconnected recesses may substitute for the configuration of the trench 146R, such as the disconnected recesses R2 of the back board 110 shown in FIG. 4.

In the present embodiments, the display device 100 folds up in a manner that the back board 110 faces outside and the cover lens 140 faces inside, while a bending stress at an outer layer is greater than a bending stress at an inner layer, a depth DE1 of the trench R1 may be designed to be greater than a depth DE2 of the trench 146R, such that the bending stress of the back board 110 may be released by the deeper trench R1. Of course, the bendable portion 146 is not limited to be the trench 146R. Herein, the bendable portion 146 may adopt any kinds of configurations of the bendable portion 116 mentioned previously, such as the disconnected recesses. On the other hand, the range of the bendable portion 116 of the back board 110 may be designed to be greater than the range of the bendable portion 146 of the cover lens 140. For example, a width of the trench R1 is greater than a width of the trench 146R. To be specific, a projection of the trench 146R on a top surface 140a of the cover lens 140 is in a projection of the bendable portion 116 of the back board 110 on the top surface 140a of the cover lens 140.

Herein, a section of the trench 146R is exemplarily depicted as a triangle, but it should not limit the scope of the present invention. In other embodiments, the section of the trench 146R may be a rectangle, a trapezoid, a half-circle, etc. In some embodiments, the shape of the trench 146R may be similar to the shape of the trench R1. In some embodiments, the number of the trench 146R may be equal to the number of the trench R1.

Other details of the present embodiments are similar to those in the present embodiments of FIG. 1B, and therefore not repeated herein.

Figure 9:
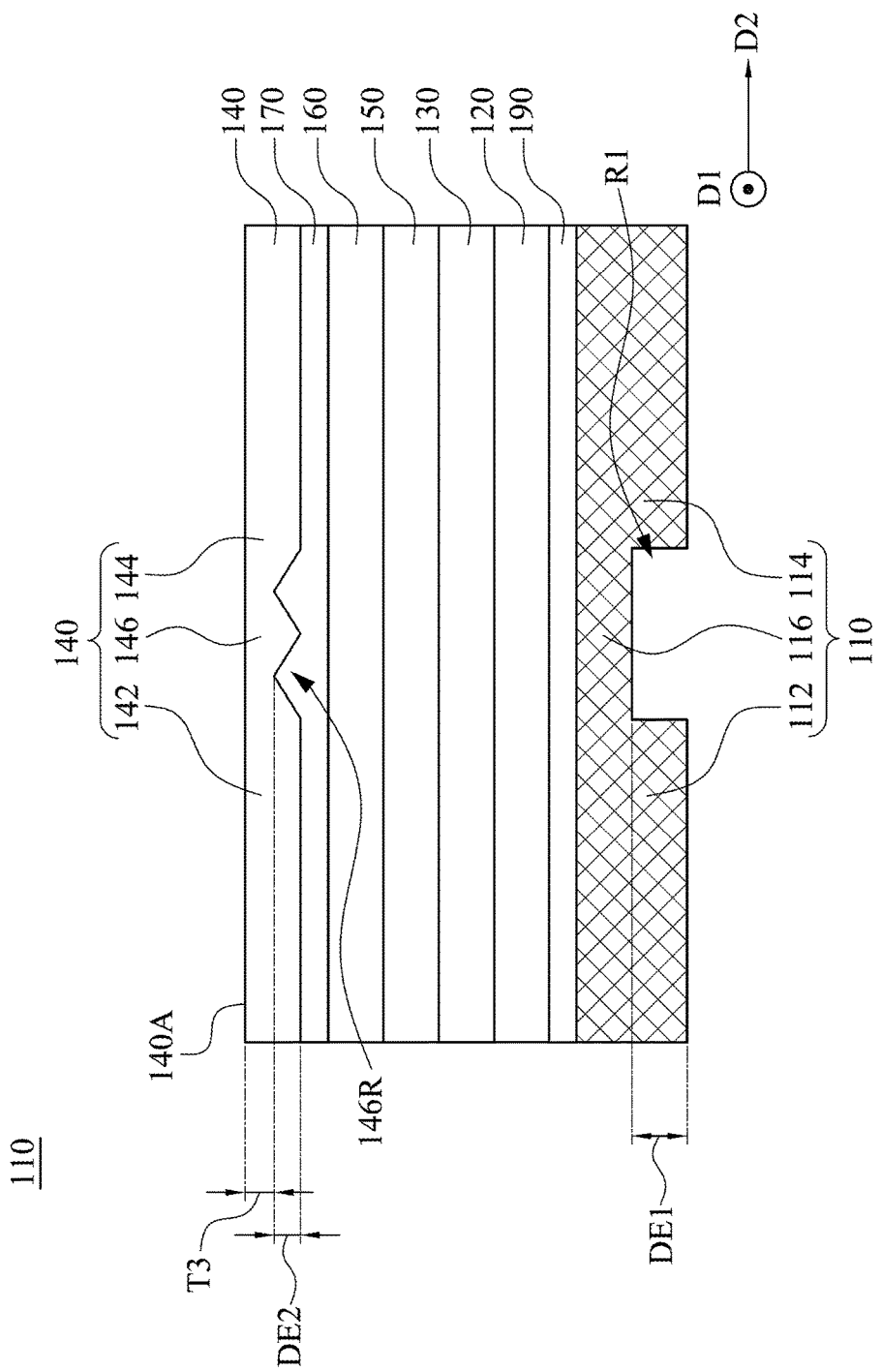
FIG. 9 is a cross-sectional schematic view of a display device according to some embodiments of the invention.

FIG. 9 is a cross-sectional schematic view of a display device 100 according to some embodiments of the invention. The present embodiments are similar to the embodiments of FIG. 8, and the difference between the present embodiments and the embodiments of FIG. 8 is: in the present embodiment, the bendable portion 146 of the cover lens 140 includes plural trenches 146R arranged along the direction D2 and extending along the same direction D1. As shown in the figure, the range of the bendable portion 116 of the back board 110 may be designed to be greater than the range of the bendable portion 146 of the cover lens 140. That is, the projection of the trenches 146R on the top surface 140a of the cover lens 140 is in a projection of the bendable portion 116 of the back board 110 on the top surface 140a of the cover lens 140. In addition, in the present embodiments, the display device 100 folds up in a manner that the back board 110 faces outside and the cover lens 140 faces inside, while a bending stress at an outer layer is greater than a bending stress at an inner layer, a depth DE1 of the trench R1 may be designed to be greater than a depth DE2 of the trenches 146R, such that the bending stress of the back board 110 may be released by the deeper trench R1.

Other details of the present embodiments are similar to those in the present embodiments of FIG. 8, and therefore not repeated herein.

Figure 10:
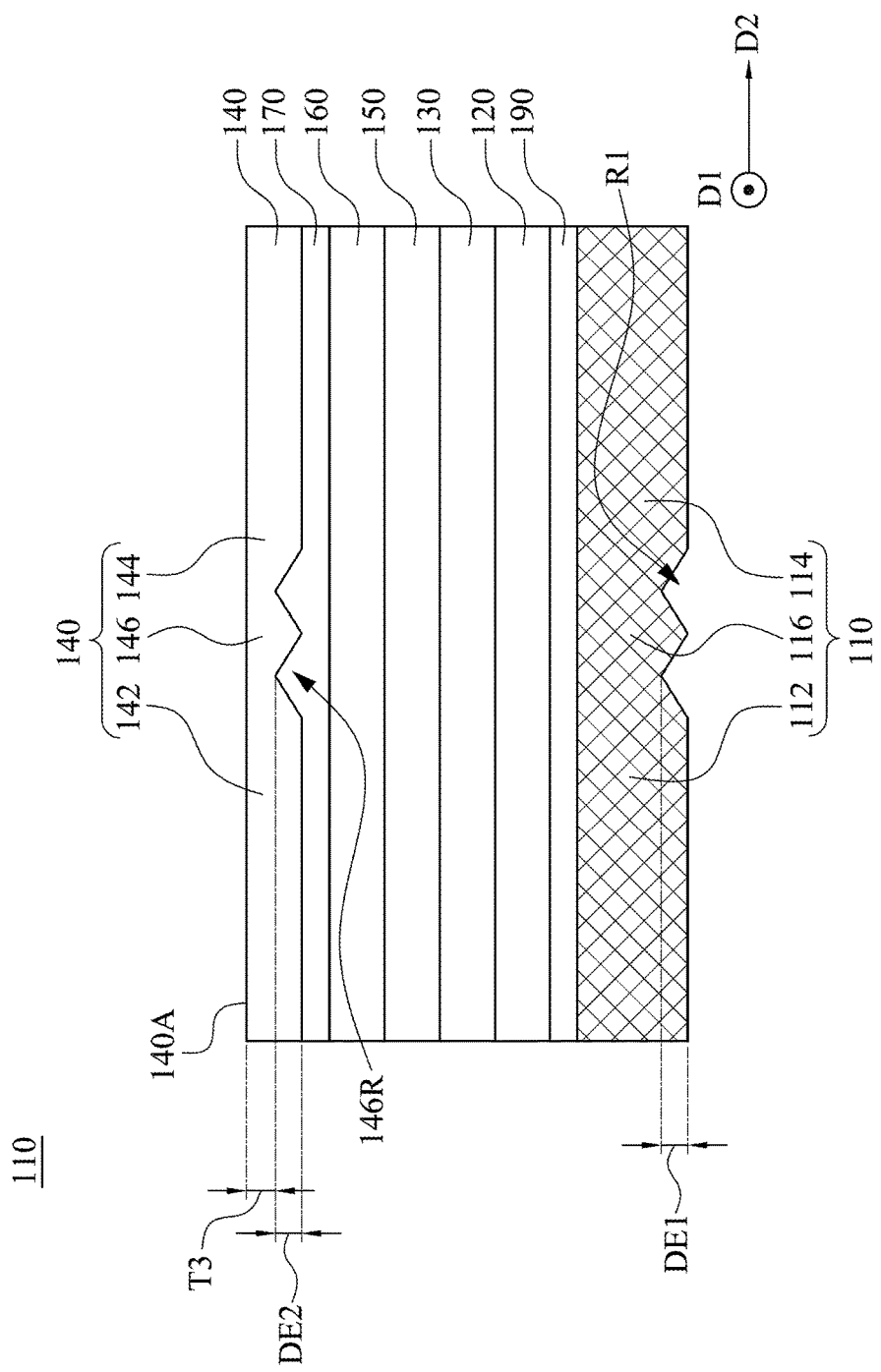
FIG. 10 is a cross-sectional schematic view of a display device according to some embodiments of the invention.

FIG. 10 is a cross-sectional schematic view of a display device 100 according to some embodiments of the invention. The present embodiments are similar to the embodiments of FIG. 9, and the difference between the present embodiments and the embodiments of FIG. 9 is: in the present embodiments, the trenches R1 and the trenches 146R has the same section and has the same or similar sizes. Herein, the sections of the trenches R1 and the trenches 146R are triangles, the triangles have the same angles, and the vertexes of the trenches R1 are corresponding to the vertexes of the trenches 146R. Through the configuration, positions of the back board 110 where the bending stress is released are corresponding to positions of the cover lens 140 where the bending stress is released.

Herein, the sections of the trenches R1 may be completely the same as the sections of the trenches 146R, and the depth DE1 of the trenches R1 is approximately equal to the depth DE2 of the trenches 146R. However, it should not limit the scope of the present invention. In other embodiments, the depth DE1 of the trenches R1 is greater than the depth DE2 of the trenches 146R, and the triangular sections of the trenches R1 may not be the same as the triangular sections of the trenches 146R, but the vertexes of the trenches R1 are kept corresponding to the vertexes of the trenches 146R. Through the configuration, positions of the back board 110 where the bending stress is released are corresponding to positions of the cover lens 140 where the bending stress is released. In another embodiment, a ratio of a length of a side of the triangles of the trenches 146R to a length of a side of the triangles of the trenches R1 is in a range of 0.5 to 0.9, or a ratio of the depth DE2 of the trenches 146R to the depth DE1 of the trenches R1 is in a range of 0.5 to 0.9.

In the present embodiments, the sections are exemplarily depicted as triangles, but as mentioned previously, the sections of the trenches R1 and 146R may be rectangles, trapezoids, triangles, half-circles, etc. In addition, in some embodiments, the number of the trenches 146R may be equal to the number of the trenches R1. Of course, it should not limit the scope of the present invention. Other details of the present embodiments are similar to those in the present embodiments of FIG. 9, and therefore not repeated herein.

Figure 11:
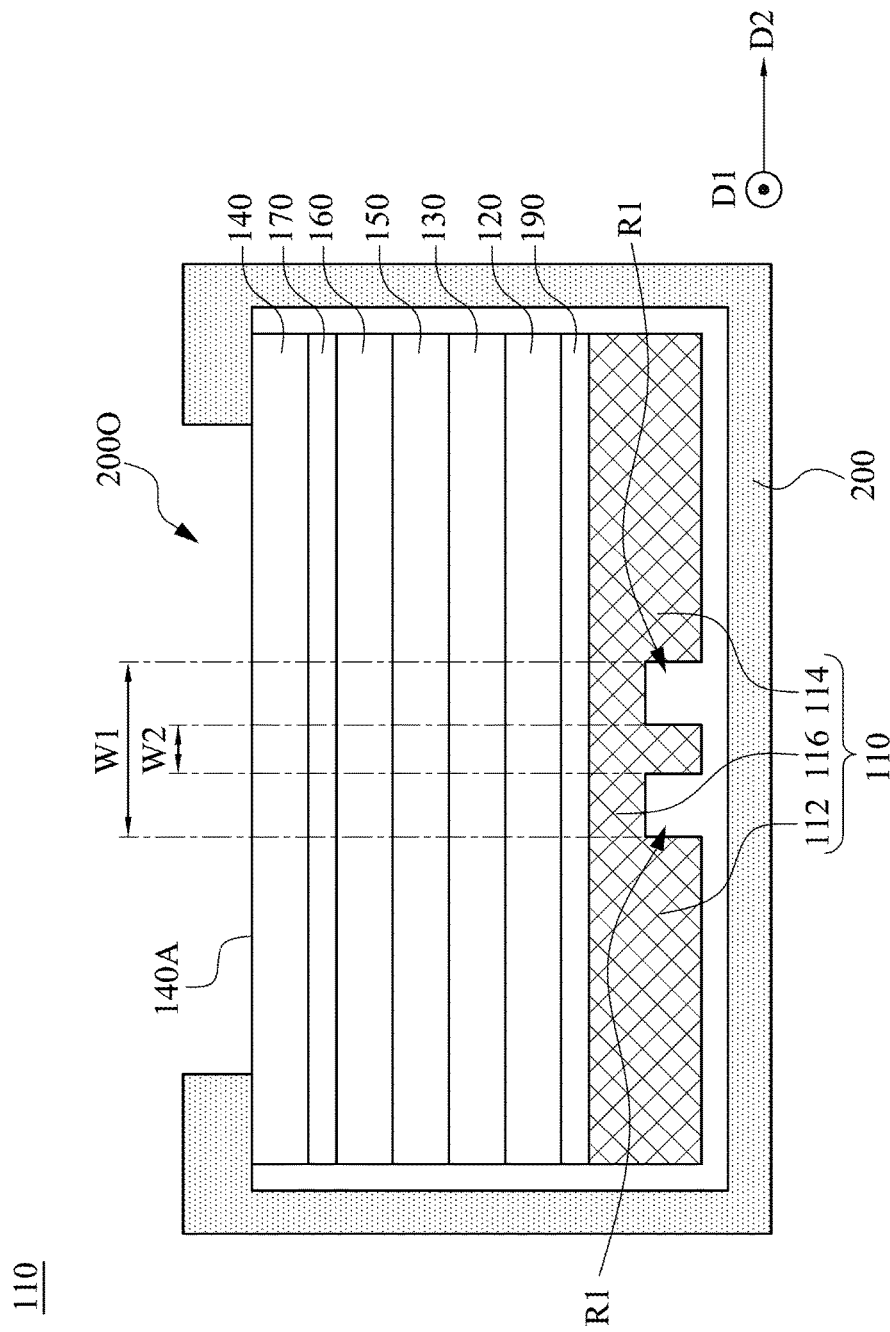
FIG. 11 is a cross-sectional schematic view of a display device according to some embodiments of the invention.

FIG. 11 is a cross-sectional schematic view of a display device 100 according to some embodiments of the invention. The present embodiments are similar to the embodiments of FIG. 6B, and the difference between the present embodiments and the embodiments of FIG. 6B is: in the present embodiments, the display device 100 further includes a shell 200 configured to protect the plural layers, and the display device 100 serves as an end product of a consumer handheld device. Herein the shell 200 at least has an opening 200O, such that an image output from the display layer 130 passes through the touch sensing layer 150, the optical film 160, and the cover lens 140, goes through the opening 200O, and then is observed by the user. The shell 200 may be formed by a flexible material. Other details of the present embodiments are similar to those illustrated previously, and therefore not repeated herein.

Figure 12:
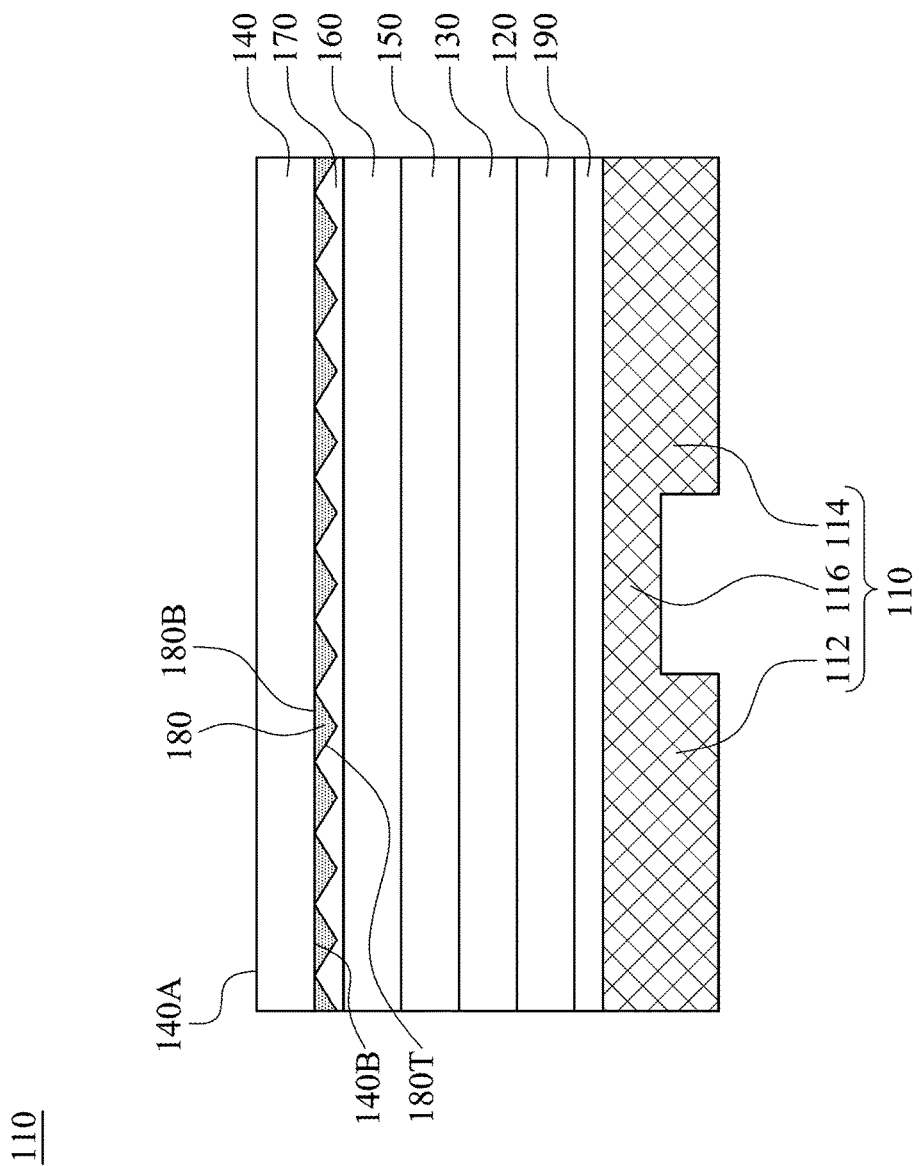
FIG. 12 is a cross-sectional schematic view of a display device according to some embodiments of the invention.

FIG. 12 is a cross-sectional schematic view of a display device 100 according to some embodiments of the invention. The present embodiments are similar to the embodiments of FIG. 1A, and the difference between the present embodiments and the embodiments of FIG. 1A is: in the present embodiments, the display device 100 may further include spacers 180. The spacers 180 are disposed between the cover lens 140 and the optical clear adhesive 170. The spacers 180 have a shape similar to a triangle. One of the spacers 180 has at least one tilted surface 180T adjoining the optical clear adhesive 170, and the tilted surface 180T slopes with respect to a bottom surface 140B of the cover lens 140.

Herein, each of the spacers 180 may have a flat bottom surface 180B and the tilted surface 180T. In the process of fabricating the display device 100, the spacers 180 may be initially disposed on the bottom surface 140B of the cover lens 140, the display layer 130, the touch sensing layer 150, and the optical film 160 are sequentially disposed on the substrate 120, and then the bottom surface 140B of the cover lens 140 is bonded with a combination of the substrate 120, the display layer 130, the touch sensing layer 150, and the optical film 160 by the optical clear adhesive 170.

Through the configuration, when a force is applied on the top surface 140A, the flat bottom surface 180B of the spacers 180 may bear the force and share the force to the optical clear adhesive 170 through the two tilted surfaces 180T. Therefore, the area of the optical clear adhesive 170 receiving the spread force is increased, thereby enhancing the resistance to the pressure of the optical clear adhesive 170, and avoiding deformation.

In the present embodiments, the spacers 180 have high transmittance, and a rigidity of the spacers 180 is greater than a rigidity of the optical clear adhesive 170, such that the spacers 180 may spread the force applied thereon to the optical clear adhesive 170. For example, the spacers 180 may be formed of organic or inorganic materials, such as photoresist. The spacers 180 may be formed by lithography and etching processes, screen printing processes, or printing processes.

In the present embodiments, the spacers 180 are connected with each other and forming a layer. However, it should not limit the scope of the present invention. In other embodiments, the spacers 180 may be separated from each other.

Herein, an angle between the tilted surface 180T and the bottom surface 140B may be a range of 20 degrees to 70 degrees, such as 45 degrees, such that the spacers 180 may spread the force applied thereon. The structures of the spacers 180 are exemplified by pyramids, which have the triangular section as shown the figure, but it should not limit the scope of the present invention. In other embodiments, the spacers 180 may have sections of trapezoids, half-circles, or other suitable shapes. For example, because of some factors in the deposition process, it is easy to form trapezoidal sections with rounded corners. Alternatively, the spacers may 180 be rods. Other details of the present embodiments are similar to those in the present embodiments of FIG. 1A, and therefore not repeated herein.

Figure 13:
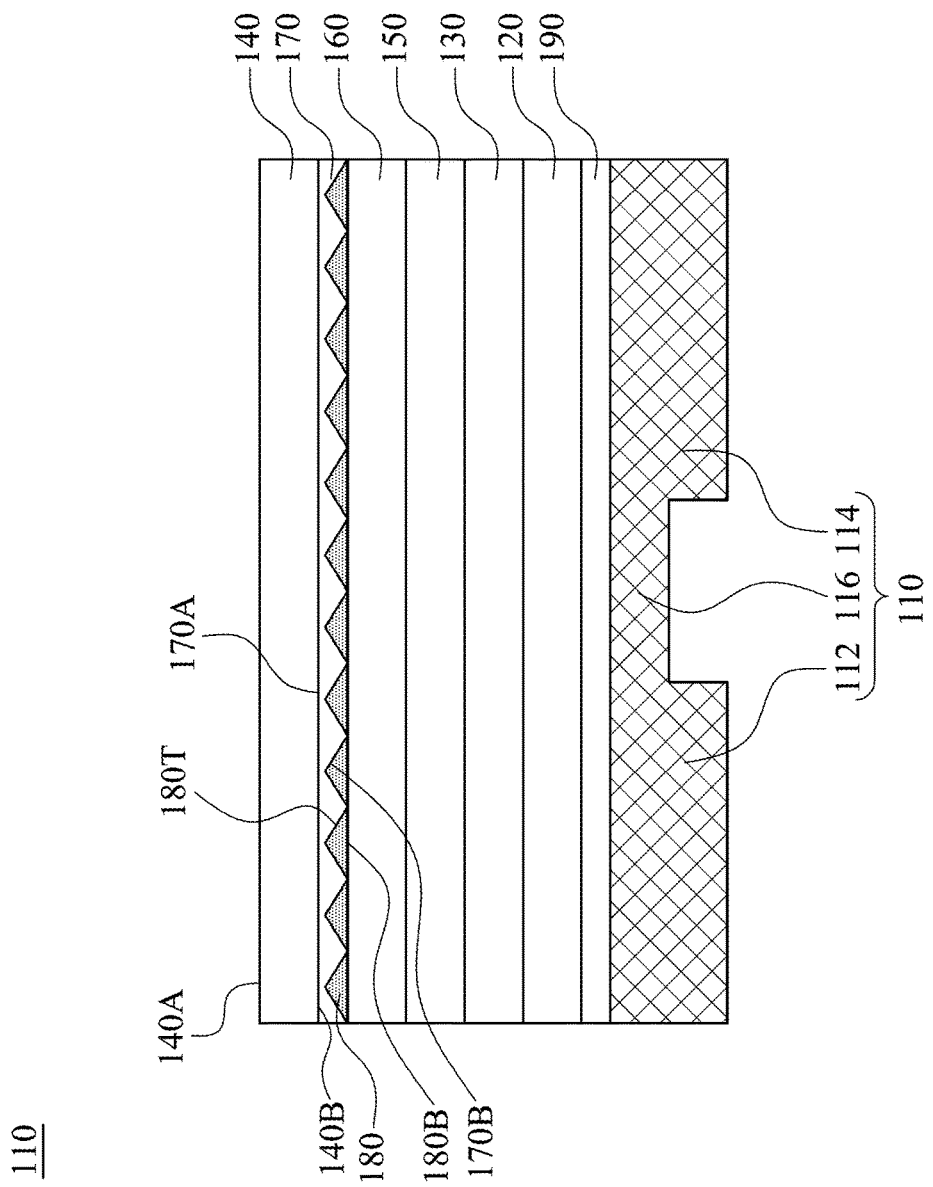
FIG. 13 is a cross-sectional schematic view of a display device according to some embodiments of the invention.

FIG. 13 is a cross-sectional schematic view of the display device 100 according to some embodiments of the invention. The present embodiments are similar to the embodiments of FIG. 12, and the difference between the present embodiments and the embodiments of FIG. 12 is: in the present embodiments, the spacers 180 are disposed between the optical clear adhesive 170 and the display layer 130. The spacers 180 has at least one tilted surface 180T adjoining the optical clear adhesive 170, and the tilted surface 180T slopes with respect to the bottom surface 140B of the cover lens 140.

Herein, each of the spacers 180 may have the flat bottom surface 180B and the tilted surface (or curved surface, not shown) 180T. In the process of fabricating the display device 100, the display layer 130, the touch sensing layer 150, and the optical film 160 are sequentially disposed on the substrate 120, the spacers 180 are disposed the optical film 160 such that the spacers 180 are attached to the optical film 160, and then the bottom surface 140B of the cover lens is bonded with the optical film 160 by the optical clear adhesive 170.

Through the configuration, when a force is applied on the top surface 140A, the top surface 170A of the optical clear adhesive 170 may bear the force and spread the force to the spacers 180 through surfaces 170B adjoining the tilted surfaces 180T. Therefore, the area of the optical clear adhesive 170 receiving the force is increased, thereby enhancing the resistance to the pressure of the optical clear adhesive 170, and avoiding deformation. Other details of the present embodiments are similar to those in the present embodiments of FIG. 12, and therefore not repeated herein.

In some embodiments of the present invention, by designing the bendable portions of the back board and the cover lens to optionally include trenches, recesses, or openings, the rigidity of the bendable portion of the back board or the cover lens is less than the rigidity of other portions, and therefore facilitate the bending of the display device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a back board, comprising a first portion, a second portion, and a bendable portion, wherein the bendable portion is between the first portion and the second portion and separating the first portion from the second portion, and a rigidity of the bendable portion is smaller than a rigidity of the first portion and the second portion;
   a substrate disposed on the first portion, the second portion, and the bendable portion, wherein the substrate is attached to the back board by an adhesive;
   a display layer disposed on the substrate; and
   a cover lens disposed on the display layer.

2. The display device of claim 1, wherein a thickness of the bendable portion is smaller than a thickness of the first portion and the second portion, such that the bendable portion, the first portion, and the second portion form a trench, wherein an opening of the trench faces away from the substrate.

3. The display device of claim 2, wherein the bendable portion comprises a plurality of openings arranged in the trench.

4. The display device of claim 1, wherein a thickness of the bendable portion is equal to a thickness of the first portion multiplied by a value ranging from 0.3 to 0.8.

5. The display device of claim 1, wherein a thickness of the bendable portion is less than 50 micrometers.

6. The display device of claim 1, wherein the bendable portion comprises a plurality of recesses, and openings of the recesses face away from the substrate.

7. The display device of claim 1, wherein the bendable portion comprises a plurality of openings.

8. The display device of claim 1, wherein the cover lens comprises a first portion, a second portion, and a bendable portion, the bendable portion of the cover lens is between the first portion and the second portion of the cover lens, the bendable portion of the cover lens is on the bendable portion of the back board, and a rigidity of the bendable portion of the cover lens is smaller than a rigidity of the first portion and the second portion of the cover lens.

9. The display device of claim 8, wherein an extending direction of the bendable portion of the cover lens is parallel with an extending direction of the bendable portion of the back board.

10. The display device of claim 8, wherein the bendable portion of the cover lens comprises at least one trench facing the substrate.

11. The display device of claim 10, further comprising:
an optical clear adhesive disposed between the display layer and the cover lens, wherein the optical clear adhesive fills the trench of the bendable portion of the cover lens.

12. The display device of claim 1, further comprising:
an optical clear adhesive disposed between the display layer and the cover lens; and
a spacer disposed between the cover lens and the optical clear adhesive, wherein the spacer has at least one tilted surface adjoining the optical clear adhesive, and the tilted surface slopes with respect to a bottom surface of the cover lens.

13. The display device of claim 1, further comprising:
an optical clear adhesive disposed between the display layer and the cover lens; and
a spacer disposed between the optical clear adhesive and the display layer, wherein the spacer has at least one tilted surface adjoining the optical clear adhesive, and the tilted surface slopes with respect to a bottom surface of the cover lens.

14. A display device, comprising:
a substrate;
a display layer disposed on the substrate; and
a cover lens disposed on the display layer, wherein the cover lens comprises a first portion, a second portion, and a bendable portion, wherein the bendable portion of the cover lens is between the first portion and the second portion of the cover lens, and a rigidity of the bendable portion of the cover lens is smaller than a rigidity of the first portion and the second portion of the cover lens, wherein the substrate is attached to a back board by an adhesive.

15. The display device of claim 14, wherein the bendable portion comprises at least one trench facing the substrate.

* * * * *